US011196360B2

(12) United States Patent
Lerner et al.

(10) Patent No.: US 11,196,360 B2
(45) Date of Patent: Dec. 7, 2021

(54) SYSTEM AND METHOD FOR ELECTROSTATICALLY CHUCKING A SUBSTRATE TO A CARRIER

(71) Applicant: Applied Materials, Inc., Santa Clara, CA (US)

(72) Inventors: Alexander N. Lerner, San Jose, CA (US); Kim Ramkumar Vellore, San Jose, CA (US); Steven Trey Tindel, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 16/655,168

(22) Filed: Oct. 16, 2019

(65) Prior Publication Data

US 2021/0028726 A1 Jan. 28, 2021

Related U.S. Application Data

(60) Provisional application No. 62/879,350, filed on Jul. 26, 2019.

(51) Int. Cl.
*H02N 13/00* (2006.01)
*C23C 16/458* (2006.01)
(Continued)

(52) U.S. Cl.
CPC ......... *H02N 13/00* (2013.01); *C23C 16/4586* (2013.01); *H01L 21/683* (2013.01);
(Continued)

(58) Field of Classification Search
CPC ......... H02N 13/00; H01L 51/00; H01L 51/56; H01L 51/0002; H01L 21/683;
(Continued)

(56) References Cited

U.S. PATENT DOCUMENTS 4,071,944 A    2/1978  Chuss et al.
4,915,057 A    4/1990  Boudreau et al.
(Continued)

FOREIGN PATENT DOCUMENTS

CN        1244165 C       3/2006
CN      200944704 Y       9/2007
(Continued)

OTHER PUBLICATIONS

International Search Report and Written Opinion for PCT/US2020/040431 dated Oct. 13, 2020.

*Primary Examiner* — Danny Nguyen
(74) *Attorney, Agent, or Firm* — Patterson + Sheridan, LLP

(57) ABSTRACT

A chucking station comprises a chuck, a power supply, and one or more pumping elements. The chuck comprises a plurality of first vacuum ports configured to interface with a surface of a substrate and a plurality of second vacuum ports configured to interface with a surface of a carrier. The chuck further comprises a first electrical pin configured to be in electrical communication with a first electrode of the carrier, and a second electrical pin configured to be in electrical communication with a second electrode of the carrier. The power supply is configured to apply a chucking voltage and a de-chucking voltage to the first and second electrical pins. The one or more pumping elements is coupled to the first and second vacuum ports and configured to generate a vacuum between the substrate and the chuck and a vacuum between the carrier and the chuck.

19 Claims, 8 Drawing Sheets

(51) Int. Cl.
*H01L 51/56* (2006.01)
*H01L 51/00* (2006.01)
*H01L 21/683* (2006.01)
*H01L 21/67* (2006.01)

(52) U.S. Cl.
CPC .......... *H01L 21/6833* (2013.01); *H01L 51/00* (2013.01); *H01L 51/0002* (2013.01); *H01L 51/56* (2013.01); *C23C 16/458* (2013.01); H01L 21/67288 (2013.01)

(58) Field of Classification Search
CPC ........... H01L 21/67288; H01L 21/6831; H01L 21/6833; H01L 21/6835; H01L 21/6838; C23C 16/5486; C23C 16/458
USPC .......................................................... 361/234
See application file for complete search history.

(56) References Cited

U.S. PATENT DOCUMENTS

| | | | |
|---|---|---|---|
| 4,952,420 A | 8/1990 | Walters | |
| 4,969,168 A * | 11/1990 | Sakamoto | ............... G03F 7/707 250/440.11 |
| 5,354,380 A | 10/1994 | Zejda | |
| 5,503,675 A | 4/1996 | Zejda | |
| 5,818,682 A | 10/1998 | Loo | |
| 6,126,382 A | 10/2000 | Scales et al. | |
| 6,665,053 B2 | 12/2003 | Korenaga | |
| 6,846,213 B2 * | 1/2005 | Sato | ........................ H01J 9/027 445/24 |
| 7,869,185 B2 | 1/2011 | Park et al. | |
| 8,282,089 B2 | 10/2012 | Heimel et al. | |
| 8,361,230 B2 | 1/2013 | Manz | |
| 8,427,253 B2 | 4/2013 | Satake et al. | |
| 8,686,819 B2 | 4/2014 | Schuessler et al. | |
| 8,817,376 B2 | 8/2014 | Lee et al. | |
| 9,013,795 B2 | 4/2015 | Lee et al. | |
| 9,045,818 B2 | 6/2015 | Gersdorff et al. | |
| 9,343,347 B2 | 5/2016 | Haas et al. | |
| 9,463,543 B2 | 10/2016 | White et al. | |
| 9,922,854 B2 | 3/2018 | Kurita et al. | |
| 10,070,520 B2 | 9/2018 | Tomita et al. | |
| 10,077,207 B2 | 9/2018 | Lee et al. | |
| 10,115,617 B2 | 10/2018 | Bluck et al. | |
| 10,297,483 B2 | 5/2019 | White et al. | |
| 2003/0219986 A1 | 11/2003 | Rattner et al. | |
| 2004/0123952 A1 | 7/2004 | Hur et al. | |
| 2007/0009671 A1 | 1/2007 | Manz | |
| 2009/0103232 A1 | 4/2009 | Ito et al. | |
| 2009/0109595 A1 | 4/2009 | Herchen et al. | |
| 2010/0194012 A1 * | 8/2010 | Tatsumi | ............... B65G 49/061 269/21 |
| 2012/0308341 A1 | 12/2012 | Ishizawa et al. | |
| 2013/0129462 A1 * | 5/2013 | Minami | ............... H01L 21/67742 414/751.1 |
| 2013/0135741 A1 | 5/2013 | Lee et al. | |
| 2014/0036404 A1 * | 2/2014 | Prahlad | .................. H02N 13/00 361/234 |
| 2015/0228517 A1 | 8/2015 | Toc et al. | |
| 2016/0196997 A1 * | 7/2016 | White | ...................... F27B 1/08 361/234 |
| 2018/0308710 A1 | 10/2018 | Chan et al. | |
| 2018/0376591 A1 | 12/2018 | Tomita et al. | |
| 2019/0010083 A1 | 1/2019 | Lee et al. | |
| 2019/0111547 A1 * | 4/2019 | Sekiya | ................ H01L 21/6833 |

FOREIGN PATENT DOCUMENTS

| | | |
|---|---|---|
| CN | 101604499 B | 4/2011 |
| CN | 102195588 A | 9/2011 |
| CN | 202189772 U | 4/2012 |
| CN | 102760679 A | 10/2012 |
| CN | 103572240 A | 2/2014 |
| CN | 204490492 U | 7/2015 |
| CN | 104820306 A | 8/2015 |
| CN | 106148908 A | 11/2016 |
| CN | 108165927 A | 6/2018 |
| CN | 208142163 U | 11/2018 |
| CN | 109561580 A | 4/2019 |
| DE | 29707686 U1 | 6/1997 |
| EP | 2494646 B1 | 12/2017 |
| EP | 2852469 B1 | 4/2019 |
| JP | 3158181 B2 | 4/2001 |
| JP | 2013245392 A | 12/2013 |
| KR | 101413206 B1 | 6/2014 |
| KR | 20180059804 A | 6/2018 |
| TW | 200730419 A | 8/2007 |
| WO | 1990004320 A2 | 4/1990 |
| WO | 2012053402 A1 | 4/2012 |
| WO | 2014114360 A1 | 7/2014 |
| WO | 2018153480 A1 | 8/2018 |
| WO | 2018153481 A1 | 8/2018 |
| WO | 2018166636 A1 | 9/2018 |
| WO | 2019020166 A1 | 1/2019 |
| WO | 2019091561 A1 | 5/2019 |
| WO | 2019101319 A1 | 5/2019 |
| WO | 2019114806 A1 | 6/2019 |

* cited by examiner

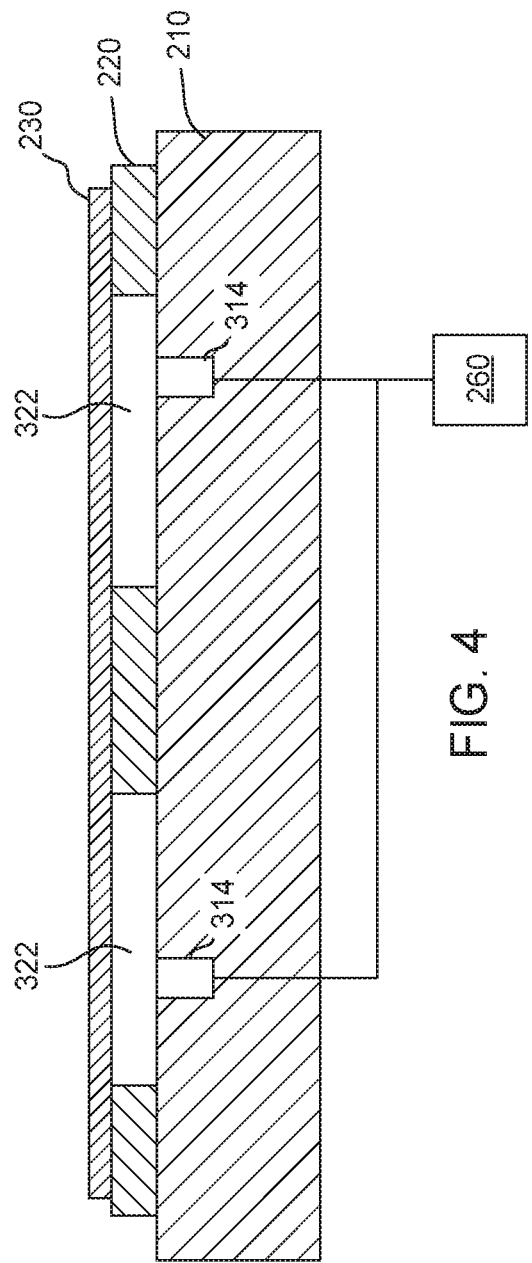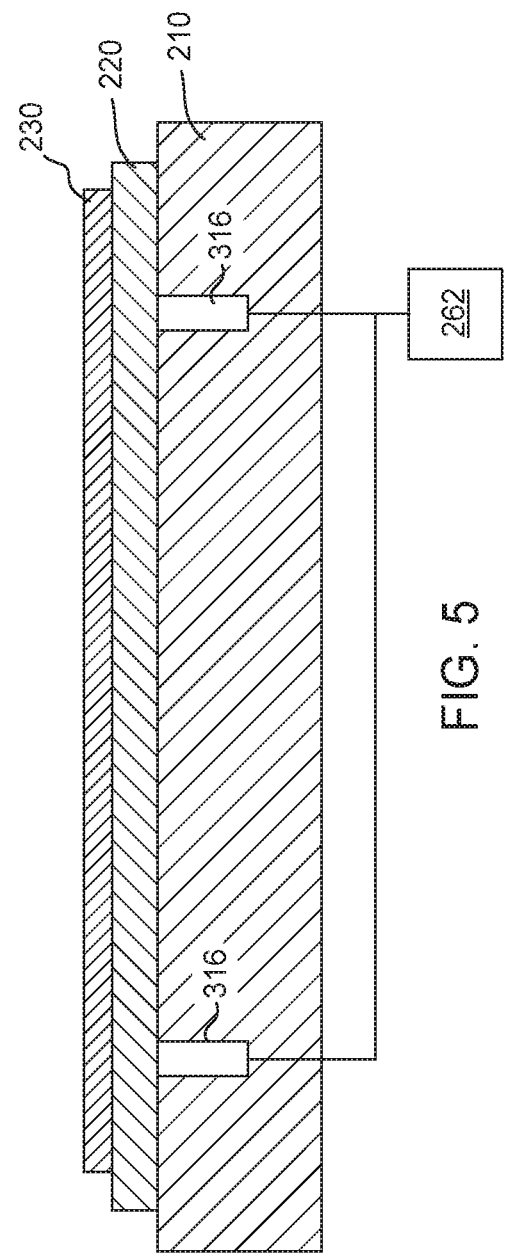

SYSTEM AND METHOD FOR ELECTROSTATICALLY CHUCKING A SUBSTRATE TO A CARRIER

CROSS REFERENCE

This application claims priority to U.S. Provisional Patent Application, 62/879,350, filed on Jul. 26, 2019, the disclosure of which is incorporated herein by reference in its entirety.

BACKGROUND

Field

Embodiments of the present disclosure generally relate to electrostatically chucking substrates to carriers.

Description of the Related Art

Organic vapor deposition is becoming increasingly relevant in building semiconductor devices and other optical devices. Vapor deposition processes, performed in evaporation chambers, generally include heating materials that are maintained at a desired pressure to a desired temperature such that the heated material is vaporized and then allowed to be transferred to a substrate where the vaporized material condenses onto a surface of the substrate. Organic vapor deposition is often used to form CMOS image sensors. However, organic vapor deposition can also be used to form organic light emitting diodes (OLEDs) organic photodetectors, solar cells, and other similar devices. These devices are used in the manufacture of television screens, computer monitors, mobile phones, and other hand-held devices for displaying information. The range of colors, brightness, and viewing angles possible with OLED displays are greater than that of traditional LED displays because OLED pixels directly emit light and do not require a back light, and thus lesson the energy consumption of the formed device. Further, OLEDs can be manufactured onto flexible substrates, resulting in further device applications as well.

The vapor deposition processes performed in the evaporation chambers are commonly used for the production of layers of a photodiode, and the photodiode may be used in CMOS image sensor (CIS) or organic light emitting diode (OLED) applications. As an example, different organic material can be selectively deposited for different, respective pixels in a CIS utilizing an organic photoconductive film (OPF). Certain pixels (e.g., for sensing red light) can utilize a first organic material, while other pixels (e.g., for sensing green or blue light) can utilize a second, different organic material. In addition to the deposition of organic layers, other processes may be performed, such as pre-clean or deposition of inorganic layers, may be performed to form the photodiode. During the deposition of the organic layers, and other processes, a substrate can be mounted on a carrier. Further, during processing, proper alignment between the substrate and the carrier is important to ensure proper deposition of the organic materials. However, current methods for mounting a substrate to a carrier are unable to ensure that that the substrate is properly aligned with the carrier.

Therefore, there is a need for an improved system and method for mounting a substrate on a carrier to mitigate movement of the substrate relative to the carrier during processing and maintain proper alignment.

SUMMARY

In an example embodiment, a method for operating a chucking station comprises generating a vacuum between a carrier and a chuck of the chucking station, and generating a vacuum between a substrate and the chuck. Generating the vacuum between the substrate and the chuck causes the substrate to be urged against a surface of the carrier. The method further comprises applying a chucking voltage to a first electrode relative to a second electrode of the carrier to electrostatically chuck the substrate to the carrier. The chucking voltage is a positive voltage pulse having a first magnitude.

In an example embodiment, a chucking station comprises a chuck, a power supply, and one or more pumping elements. The chuck comprises a plurality of first vacuum ports configured to interface with a surface of a substrate when the substrate is positioned over a surface of the chuck and a plurality of second vacuum ports configured to interface with a surface of a carrier when the carrier is positioned on the surface of the chuck. The chuck further comprises a first electrical pin configured to be in electrical communication with a first electrode of the carrier when the carrier is positioned on the surface of the chuck, and a second electrical pin configured to be in electrical communication with a second electrode of the carrier when the carrier is positioned on the surface of the chuck. The power supply is configured to apply a chucking voltage and a de-chucking voltage to the first and second electrical pins. The one or more pumping elements is coupled to the first and second vacuum ports and configured to generate a vacuum between the substrate and the chuck and a vacuum between the carrier and the chuck.

In example embodiment, a processing system for processing a substrate comprises one or more processing chambers, a transfer chamber comprising a transfer chamber robot configured to transfer the substrate and a carrier to the one or more processing chambers, one or more load lock chambers connected to the transfer chamber, a chucking station, and a transfer robot configured to transfer wafers and carriers between the one or more load lock chambers and the chucking station. The chucking station comprises a chuck, a power supply, and one or more pumping elements. The chuck comprises a plurality of first vacuum ports configured to interface with a surface of a substrate when the substrate is positioned over a surface of the chuck, and a plurality of second vacuum ports configured to interface with a surface of a carrier when the carrier is positioned on the surface of the chuck. The chuck further comprises a first electrical pin configured to be in electrical communication with a first electrode of the carrier when the carrier is positioned on the surface of the chuck, and a second electrical pin configured to be in electrical communication with a second electrode of the carrier when the carrier is positioned on the surface of the chuck. The power supply is configured to apply a chucking voltage and a de-chucking voltage to the first and second electrical pins. The one or more pumping elements is coupled to the first and second vacuum ports and configured to generate a vacuum between the substrate and the chuck and a vacuum between the carrier and the chuck.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be con

FIGS. 3, 4, and 5 are schematic illustrations of a chuck, a carrier and a substrate, according to one or more embodiments.

Figure 1:
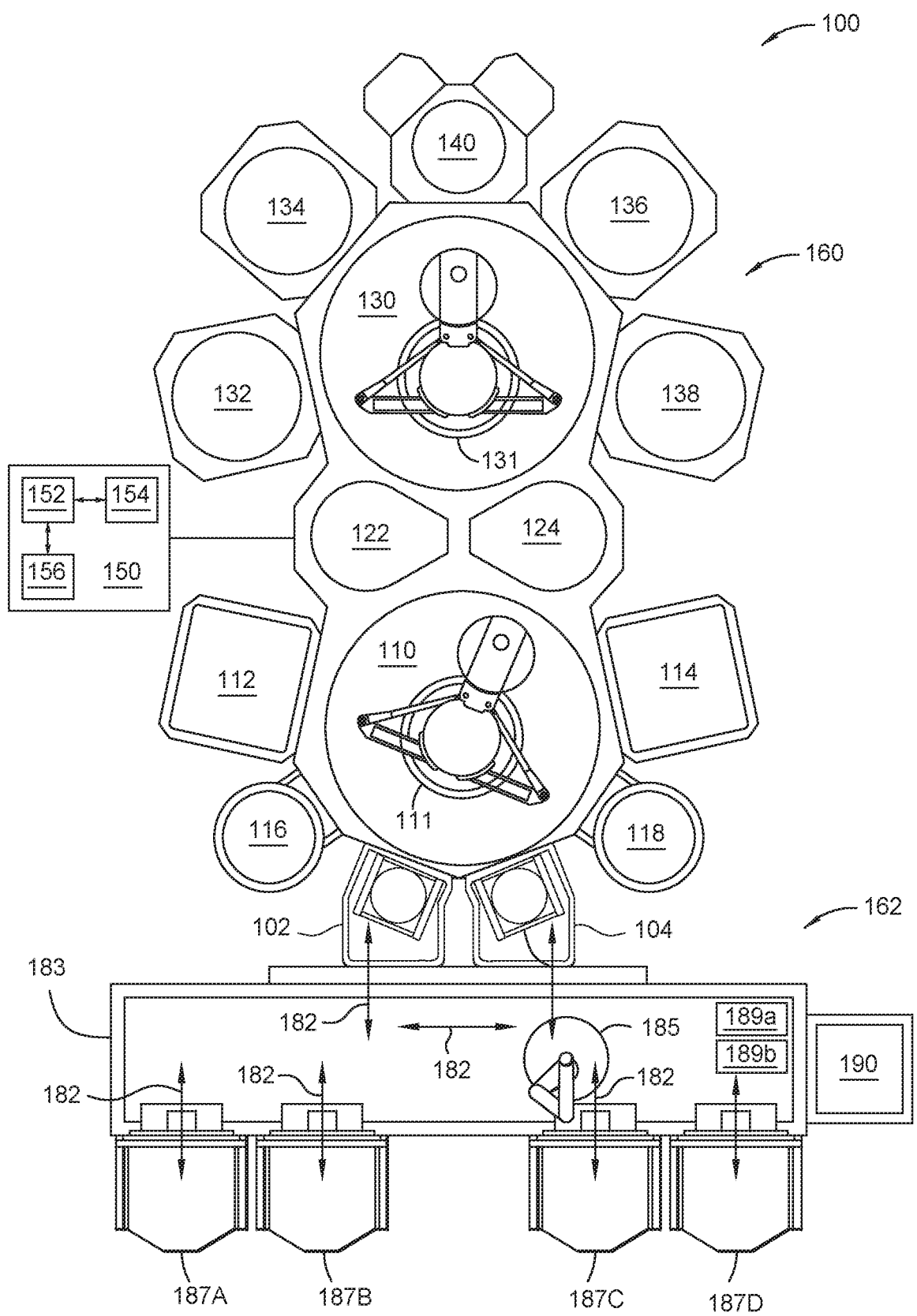
- FIG. 1 illustrates a processing system for processing a substrate, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Organic vapor deposition processes are becoming increasingly relevant in building many different types of electronic devices today. In some of these devices, one or more layers of organic and inorganic materials are disposed on a substrate to form at least part of an electronic device, such as a photodiode and the like. Due to attributes of the substrate and/or the need for deposition masks commonly used in the vapor deposition processes, before processing, the substrate is positioned on and electrostatically chucked to the carrier. To ensure proper alignment between the substrate and the carrier during the electrostatic chucking process, a vacuum is generated between the carrier and the substrate to inhibit and/or prevent the movement of the substrate relative to the carrier during the chucking process. Further, at the end of processing, the processed substrate is removed (electrostatically de-chucked) from the carrier. Accordingly, a chucking station that is configured to electrostatically chuck a substrate to a carrier may be also configured to electrostatically de-chuck the substrate from the carrier.

FIG. 1 illustrates a processing system 100 for processing a substrate, according to one or more embodiments. For example, the processing system 100 may deposit one or more metal oxide layers and/or organic materials on a substrate to fabricate an electronic device, such as a light sensing device. For example, the light sensing device may be an organic image sensing device. An example of a processing system includes the ENDURA® system, commercially available from Applied Materials, Inc. of Santa Clara, Calif. Alternatively, other substrate processing systems may be also be modified in accordance with the present disclosure.

The processing system 100 includes a vacuum-tight processing platform 160, a factory interface 162, and a controller 150. Further, the processing system 100 may also be referred to as a cluster tool or multi-chamber processing system.

The processing platform 160 includes one or more processing chambers. For example, the processing platform 160 may include processing chambers 112, 114, 116, 118, 132, 134, 138, 136, and 140. Further, the processing platform 160 includes one or more transfer chambers. For example, as is illustrated in FIG. 1, the processing platform 160 includes transfer chambers 110 and 130. The processing platform 160 may also include one or more pass through chambers that allow a substrate to be transferred between transfer chambers. For example, the pass through chambers 122, 124 may allow a substrate to be transferred between the transfer chambers 110 and 130.

The processing platform 160 may also include one or more load lock chambers. For example, as is illustrated in FIG. 1, the processing platform 160 includes load lock chambers 102, 104. The load lock chambers 102, 104 may be pumped down to be operated under a vacuum before transferring substrates from the factory interface 162 to the transfer chamber 110.

The factory interface 162 includes one or more docking stations 183, one or more factory interface robots 185, and a chucking station (e.g., a substrate carrier chamber) 190. The docking stations 183 include one or more front opening unified pods (FOUPS) 187A-187D. The factory interface robot 185 may be capable of linear and rotational movement illustrated by arrows 182. Further, the factory interface robot 185 may transfer substrates between the FOUPS 187, the load lock chambers 102, 104 and the chucking station 190. The chucking station 190 is configured to mount (electrostatically chuck) a substrate on a carrier or remove a supported substrate from a carrier. A carrier may include one or more conductive elements (e.g., chucking electrodes) configured to electrostatically chuck the substrate against the carrier. The carrier and "chucked" substrate may be transferred by the factory interface robot 185 from the chucking station 190 to one or more of the load lock chambers 102, 104. Additionally, the carrier and a processed substrate may be transferred from the load lock chambers 102, 104 to the chucking station 190 such that the processed substrate may be removed from the carrier, and the processed substrate may be transferred from the chucking station 190 to one of the FOUPS 187 by the factory interface robot 185. The chucking station 190 and method for electrostatically chucking and de-chucking a substrate to and from a carrier are described in greater detail with regard to FIGS. 2-11. One or more substrate and/or carrier pre-aligners are disposed in the factory interface 162 to align and orient the substrate and the carrier so that the substrate can be desirably positioned on the carrier in a desired orientation in the chucking station 190. In one embodiment, a first pre-aligner 189a is utilized to orient and align the substrate by identifying the center of the substrate and a notch on the substrate so that the substrate can be properly oriented relative to and then desirably positioned on components within the chucking station 190 and eventually on a carrier. In some embodiments, a second pre-aligner 189b can be utilized to orient and align the carrier by identifying the center of the carrier and a notch on the carrier so that the carrier can be properly oriented relative to and then desirably positioned on components within the chucking station 190. However, in some embodiments, a single pre-aligner is utilized at different times to orient and align the substrate relative to a position in the chucking station 190 or relative to the robot 185, and also orient and align the carrier relative to the position in the chucking station 190 or relative to the robot 185.

The transfer chamber 110 includes a transfer robot 111. The transfer robot 111 transfers substrates to and from the load lock chambers 102, 104, to and from the processing chambers 112, 114, 116, and 118, and to and from pass through chambers 122, 124. The pass through chambers 122 and 124 may be utilized to maintain vacuum conditions while allowing substrates to be transferred within the processing system 100 between transfer chambers 110 and 130. The transfer robot 131 transfers substrates between the pass through chambers 122, 124 and the processing chambers 132, 134, 136, 138, and 140, and between the processing chambers 132, 134, 136, 138, and 140.

The processing chambers 112, 114, 116, 118, 132, 134, 138, 136, and 140 may be configured in any manner suitable to process a substrate. For example, the processing chambers 112, 114, 116, 118, 132, 134, 138, 136, and 140 may be configured to deposit one or more metal oxide layers, one or more organic films and apply one or more cleaning processes to a substrate to create a semiconductor device such as a photodetector (e.g., a photodiode or the like).

A first one or more of the processing chambers (e.g., the processing chambers 112, 114, 116, and 118) is configured to perform a pre-clean process to eliminate contaminants and/or degas volatile components from a substrate prior to transferring the substrate into another process chamber. The processing chamber 138 may be configured to deposit one or more layers on a substrate. The one or more layers may be fabricated from indium tin oxide (ITO), silicon oxide, silicon nitride, aluminum oxide, or any suitable material.

The processing chambers 132, 134, and 136 may be configured to deposit one or more organic films on a substrate. Further, the processing chamber 140 may be configured to position a mask (e.g., a shadow mask) on a substrate before the substrate is transferred to one or more the processing chambers 132, 134, 136 and 138 and unload a mask from a substrate after processing within one or more of the processing chambers 132, 134, 136, and 138. The processing chambers 132, 134, 138, and 136 may be configured to deposit materials (e.g., metal oxide layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others.

The controller 150 is configured to control the components of the processing system 100. The controller 150 may be any suitable controller for controlling the operation of one or more of the processing chambers, the transfer chambers, pass through chambers, and the factory interface. For example, the controller 150 may be configured to control the operation of transfer robot 111 and/or the transfer robot 131. The controller 150 includes a central processing unit (CPU) 152, a memory 154, and support circuits 156. The CPU 152 may be any general purpose computer processor that may be utilized in an industrial environment. The support circuits 156 are coupled to the CPU 152 and may include cache, clock circuits, input/output subsystems, power supplies and the like. Software routines may be stored within the memory 154. The software routines may be executed by the CPU 152 and thus be adapted to cause various components within the processing system 100 to perform one or more of the methods described herein. Alternatively, or additionally, one or more of the software routines may be executed by a second CPU not illustrated. The second CPU may be part of the controller 150 or remote from the controller 150.

One or more processing chambers, one or more transfer chambers, one or more pass through chambers, and/or the factory interface may have a dedicated controller or controllers (not shown) configured to control at least a portion of the methods disclosed herein. The dedicated controllers may be configured similar to the controller 150 and may be coupled with the controller 150 to synchronize processing of a substrate within the processing system 100.

Figure 2:
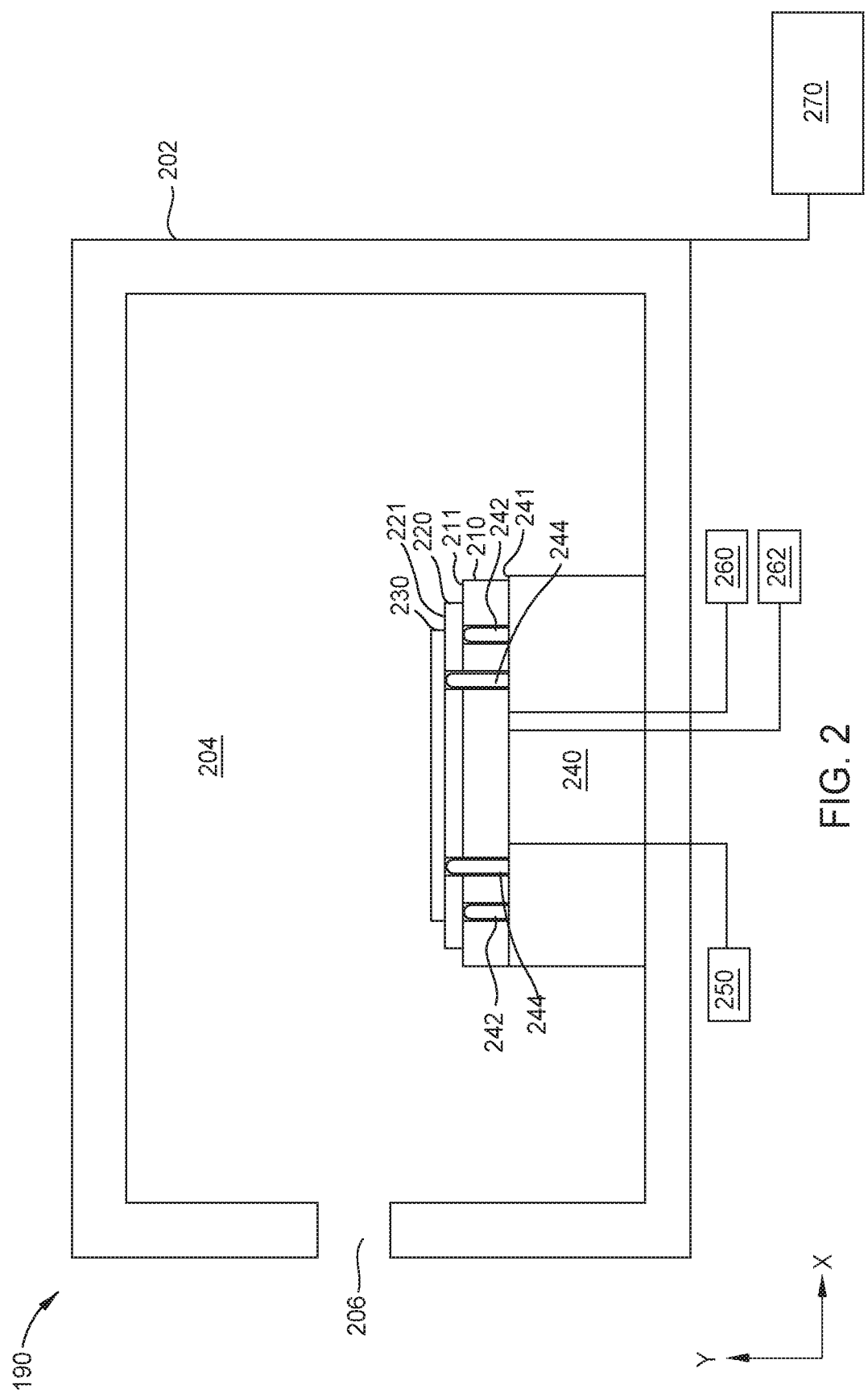
FIG. 2 is a schematic illustration of a chucking station, according to one or more embodiments.

FIG. 2 illustrates the chucking station 190, according to one or more embodiments. The chucking station 190 includes a chamber body 202, a chuck 210, an actuator assembly 240, a power supply 250, pumping devices 260, 262, and a controller 270. Alternatively, the controller 270 may be omitted and the chucking station 190 may be controlled by the controller 150.

The chuck 210 is configured to support a carrier 220 and a substrate (or wafer) 230 within the interior region 204 of the chucking station 190. The substrate 230 and the carrier 220 may transferred into the interior region 204 by the factor interface robot 185 via opening 206 in the chamber body 202. While not illustrated, a valve assembly (e.g., slit valve or gate valve) may be disposed within the opening 206 to seal the interior region 204 from the area external to the chucking station 190.

Electrical components within the chuck 210 are coupled to the power supply 250 and various features, cavities and plenums formed in the chuck 210 are in fluid communication with the pumping devices 260, 262. The pumping devices 260, 262 are configured to generate a vacuum in a cavity formed between the substrate 230 and the carrier 220 and a vacuum in the cavity between the carrier 220 and the chuck 210 to mitigate and/or prevent movement of the substrate 230 relative to the carrier 220 during the chucking process. The power supply 250 provides chucking voltages to one or more electrodes disposed within the carrier 220 via electrical pins disposed within the chuck 210 to electrostatically chuck (e.g., electrostatically hold) the substrate 230 to the carrier 220. The pumping devices 260, 262 and the power supply 250 may be controlled by the controller 270. Alternatively, one or more of the pumping devices 260, 262 and the power supply 250 may be controlled by the controller 150.

The actuator assembly 240 includes pins 242 and pins 244. The actuator assembly 240 may separately move the pins 242 and 244 in a vertical direction (e.g., +Y and −Y direction) toward and away from the surface 241 of the actuator assembly by use of one or more actuators (not shown in FIG. 2). For example, the pins 242 may move toward the surface 241 actuator assembly 240 (e.g., −Y direction) to lower the carrier 220 onto the chuck 210 when the carrier 220 is placed into the chucking station 190 by the factor interface robot 185. Further, the pins 242 may be moved away from the surface 221 of the actuator assembly 240 (e.g., +Y direction) and placed in an extended position (e.g., loading position) to receive the carrier 220 when the carrier 220 is transferred into the interior region 204 by the factor interface robot 185. Further, the pins 242 may be moved away from the surface 221 of the actuator assembly 240 (e.g., +Y direction) and positioned in a unloading position to lift the carrier 220 off of the chuck 210 such that the factor interface robot 185 may pick up and transfer the carrier 220 from the chucking station 190.

The pins 244 may be moved toward the surface 241 of actuator assembly 240 (e.g., −Y direction) to lower the substrate 230 onto the carrier 220 after the substrate 230 is transferred into the chucking station 190 by the factor interface robot 185. The pins 244 may be moved away from the actuator assembly 240 (e.g., +Y direction) and placed in an extended position (e.g., a loading position) to receive the substrate 230. Further, the pins 244 are moved away from the actuator assembly 240 (e.g., +Y direction) and placed in an unloading position to lift the substrate 230 off of the carrier 220 such that the substrate 230 may be removed from the chucking station 190.

The actuator assembly 240 may include one or more actuators (e.g., vertical actuators) configured to move the pins 242 and 244 toward and away from the surface 241 (e.g., a +Y and/or a −Y direction). The actuators of the actuator assembly 240 may be controlled by the controller 270. Alternatively, the actuators of the actuator assembly 240 may be controlled by the controller 150.

Figure 3:
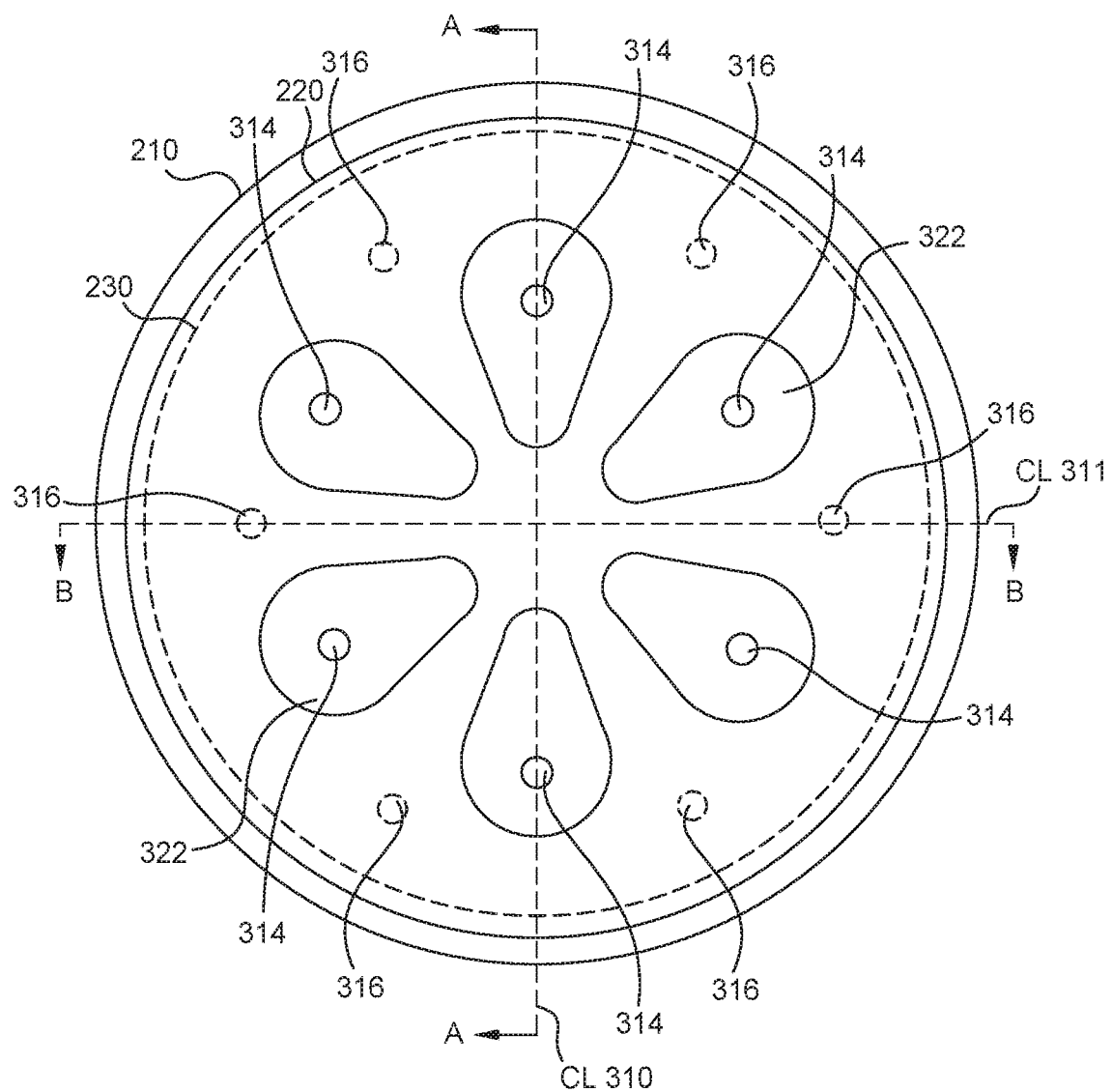

FIG. 3 is a top schematic view of the carrier 220 disposed over the chuck 210. A substrate 230 is disposed over the carrier 220. The substrate 230 is shown in phantom (e.g., dashed lines) such that the features of the underlying carrier 220 may be visible. The carrier 220 includes cutout regions 322 is the carrier 220. For example, the cutout region 322 may be included to reduce the weight of the carrier 220. The carrier 220 may include one or more cutout regions 322. Further, the cutout regions 322 may each be the same size or one or more of the cutout regions 322 may be larger than another one of the cutout regions 322. Additionally, or alternatively, the cutout regions 322 may be arranged such that the cutout regions 322 are symmetric about centerline 310 and/or centerline 311 of the carrier 220. Further, the cutout regions 322 may be arranged such that the cutout regions 322 are not symmetric about a centerline of the carrier 220. Each of the cutout regions 322 may have a common shape, or one or more of the cutout regions 322 may have a shape different from that of another one of the cutout regions 322. Further, the shape of one or more of the cutout regions 322 may differ from that illustrated in FIG. 3.

The chuck 210 includes vacuum ports 314 and 316. The vacuum ports 314 and 316 are connected to pumping devices 260, 262, respectively, such that a vacuum can be selectively formed in a cavity formed between the carrier 220 and the chuck 210 and a cavity formed between the substrate 230 an the chuck 210. As illustrated, the vacuum ports 314 are positioned underneath the substrate and aligned with the cutout regions 322 so that a vacuum generated in the vacuum ports 314 by the pumping device 260 is able to interact with the substrate 230. For example, the vacuum ports 314 may be utilized to generate a vacuum between the substrate 230 and the chuck 210. Alternatively, the vacuum ports 314 may be positioned in different locations such that vacuum ports 314 are able to interact with the substrate 230. For example, one or more of the vacuum ports 314 may be located outside the cutout regions 322. Further, the number of the vacuum ports 314 may differ from the number illustrated in FIG. 3. For example, while there are six vacuum ports 314 illustrated, the chuck 210 may have more than or less than six vacuum ports 314.

The vacuum ports 316 are configured to interact with portions of the carrier 220. For example, the vacuum ports may be utilized to generate a vacuum between the carrier 220 and the chuck 210. Further, as the vacuum ports 316 are obscured by the carrier 220, the vacuum ports 316 are shown in phantom. As illustrated, the chuck 210 includes six vacuum ports 316. Alternatively, the chuck 210 may include more than or less than six vacuum ports 316.

FIG. 4 is an illustration of schematic view of section A-A of FIG. 3. For example, FIG. 4 illustrates a partial schematic view of the substrate 230 disposed over the carrier 220 and the chuck 210. As is described with regard to FIG. 3, the carrier 220 includes cutout regions 322. Further, the vacuum ports 314 of the chuck 210 are aligned with the cutout regions 322 such that a positive pressure or vacuum generated by the pumping device 260, which is fluidly coupled to the vacuum ports 314 via the plumbing line 651 (FIG. 6), is configured to be provided to a surface of the substrate 230.

FIG. 5 is an illustration of schematic view of section B-B of FIG. 3. For example, FIG. 5 illustrates a partial schematic view of the substrate 230 disposed over the carrier 220 and the chuck 210. As is described with regard to FIG. 3, the vacuum ports 316 of the chuck 210 are configured to interact with the carrier 220. Further, the vacuum ports 316 of the chuck 210 are aligned with the carrier 220 such that a positive pressure or vacuum generated by the pumping device 262, which is fluidly coupled to the vacuum ports 316 via the plumbing line 652 (FIG. 6), is configured to be provided to a surface of the carrier 220.

Figure 6:
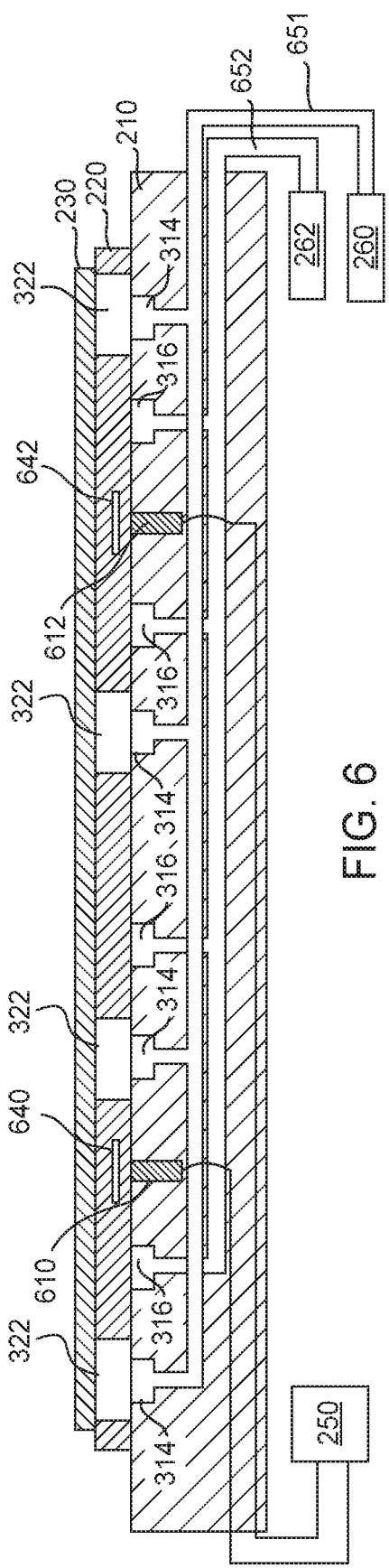

FIG. 6 is a schematic section view of a portion of the chucking station 190, according to one or more embodiments. The pumping devices 260 and 262 are coupled to vacuum ports 314 and 316, respectively. For example, the pumping devices 260 and 262 may be coupled to the vacuum ports 314 and 316 through one or more isolation valves (not shown). The pumping device 262 can be configured to generate a vacuum in the cavity between the carrier 220 and the chuck 210 via the vacuum ports 316. The pumping device 260 can be configured to generate a vacuum in the cavity between the carrier 220 and the chuck 210 via the vacuum ports 314. Generating the vacuum between the carrier 220 and the chuck 210, and between the carrier 220 and the substrate 230, is used to hold the carrier 220 and the substrate 230 in a substantially constant position relative to each other while the substrate 230 is electrostatically chucked to the carrier 220. Additionally, as discussed above, the pumping device 260 may pump a gas into the cavity between the chuck 210 and the substrate 230 via the vacuum ports 314. For example, pumping a gas into the space between the chuck 210 and the substrate 230 may be utilized to determine when the substrate 230 has been electrostatically de-chucked from the carrier 220. Further, the pumping device 260, or plumbing line 651, may include a sensor (not shown) that is configured to monitor the pressure of the gas between the chuck 210 and the substrate 230 to determine whether or not the substrate 230 is electrostatically chucked to the carrier 220 during an electrostatic chucking process or during an electrostatic de-chucking process.

The chuck 210 further includes electrical pins 610 and 612. The electrical pins 610 and 612 are coupled to power supply 250. The power supply 250 may drive the electrical pins 610 and 612 such that the electrical pins 610 and 612 are electrically biased with relative to each other. For example, the electrical pin 610 may be driven with a positive voltage (e.g., at least about 1 KV) and the electrical pin 612 may be driven a corresponding negative voltage (e.g., at least about −1 KV). Driving the electrical pins 610 and 612 alters the charge on the electrodes 640 and 642 of the carrier 220, generating an electrostatic chucking force between the substrate 230 and the carrier 220. Further, the power supply 250 may drive the electrical pins 610 and 612 with other voltages to electrostatically de-chuck, or decouple, the substrate 230 from the carrier 220. For example, the power supply 250 may drive the electrical pins 610 and 612 with voltages of the opposite polarity as described above to electrostatically de-chuck the substrate 230 from the carrier 220.

Figure 7:
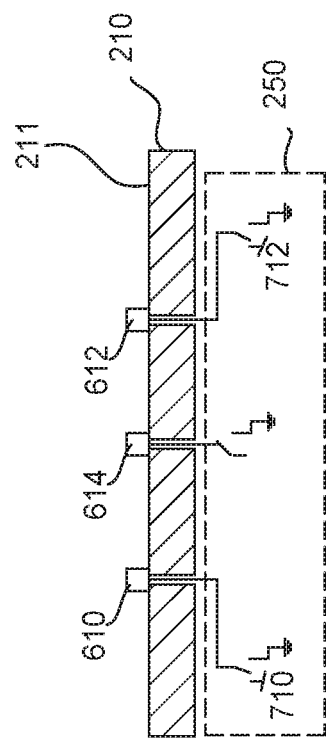

FIG. 7 is a schematic section view of a portion of the chuck 210 and the power supply 250, according to one or more embodiments. As illustrated, the chuck 210 includes the electrical pins 610, 612, and 614. The electrical pin 614 is optional and may be omitted in some instances. The electrical pins 610, 612, and 614 are connected to the power supply 250. FIG. 7 illustrates a simplified version of the power supply 250. The power supply 250 may selectively drive the electrical pin 610 with a ground voltage and voltage 710. Further, the power supply may selectively drive the electrical pin 612 with a ground voltage and the voltage 712. The voltages 710 and 712 may be chucking and/or de-chucking voltages having a similar magnitude and opposite polarities. For example, the voltages 712 and 714 may have a magnitude of about 1 KV. However, voltages having other magnitudes may be utilized. Additionally, or alternatively, the power supply 250 may drive the electrical pins 610 and 612 with additional voltages. For example, the electrical pins 610, 612 may be driven with more than three or more voltages, respectively. Further, the power supply 250 may drive the electrical pin 614 with a ground signal or electrically float the electrical pin 614. The electrical pins 610, 612, and 614 may at least partially extend beyond the surface 211 of the chuck 210. Alternatively, the electrical pins 610, 612, 614 may not extend beyond the surface 211 of the chuck 210. Further, the electrical pins 610, 612, and 614 are configured to electrically couple to corresponding electrodes of the carrier 220 (e.g., the electrodes 640, 642).

Figure 8:
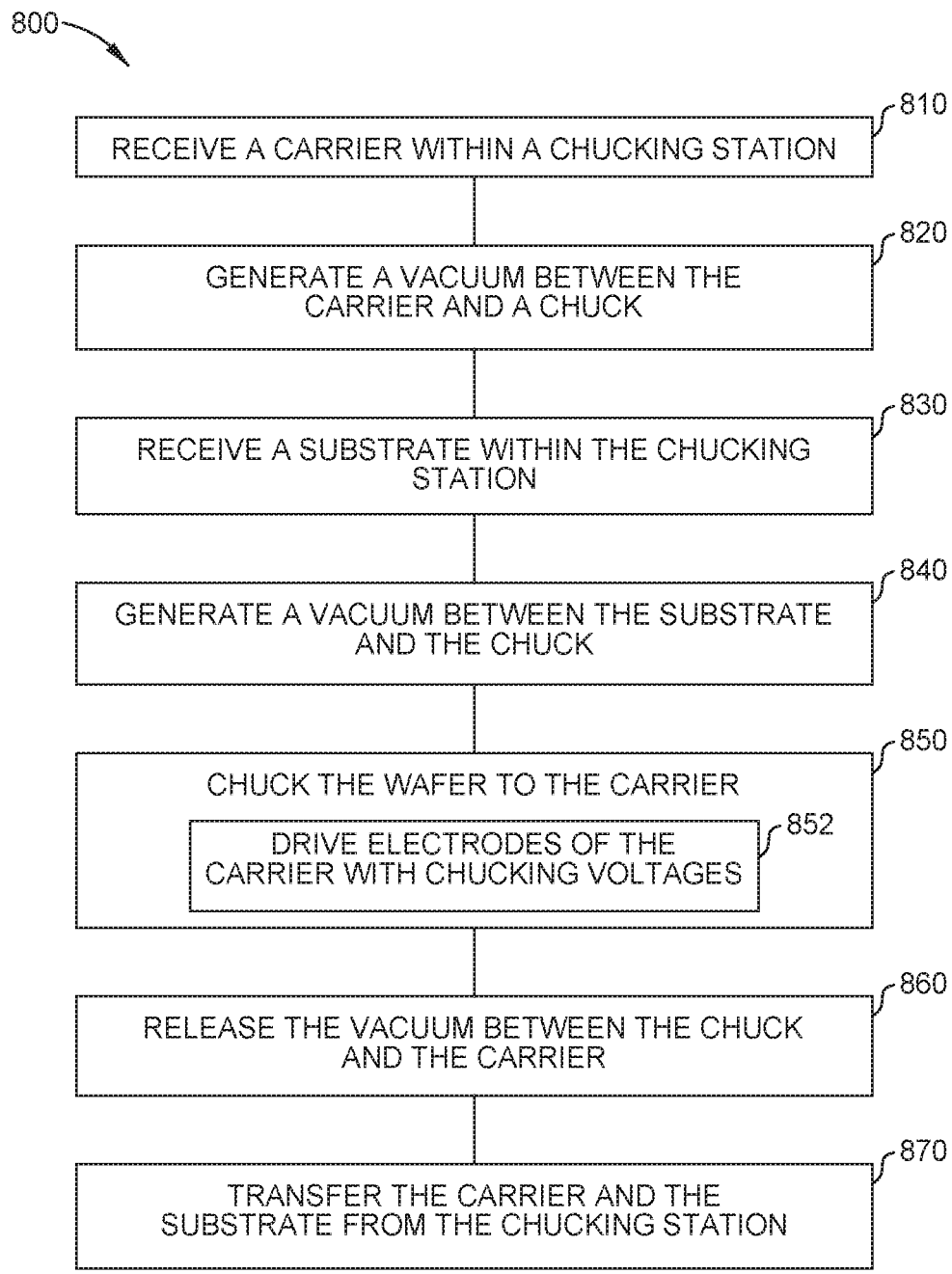
FIG. 8 illustrates a method for electrostatically chucking a substrate to a carrier, according to one or more embodiments.

FIG. 8 illustrates a flow chart of a method 800 for electrostatically chucking a substrate to a carrier, according to one or more embodiments. At operation 810, a carrier is received within a chucking station. For example, the carrier 220 may be transferred into the chucking station 190 by the factor interface robot 185 via the opening 206 and placed on the pins 242. Before the carrier 220 is transferred into the chucking station 190, the actuator assembly 240 extends the pins 242 into a loading position, such that the pins 242 are extended beyond the surface 211 of the chuck 210. The carrier 220 may be positioned by the factor interface robot 185 over the chuck 210 such that the pins 242 are aligned with one or more alignment features of the carrier 220. After the robot retracts, the actuator assembly 240 lowers the pins 242 to lower the carrier 220 towards the surface 241 of the actuator assembly 240, and thus eventually positioning the carrier 220 onto the surface 211 of the chuck 210.

At operation 820, a vacuum is generated between the carrier and chuck. For example, the pumping device 260 may remove air from a space (e.g., cavity) disposed between the carrier 220 and the chuck 210 via the vacuum ports 316 to generate a vacuum pressure between the carrier 220 and the chuck 210, which cause the external atmospheric pressure to urge the carrier against the chuck 210.

At operation 830, a substrate is received within a chucking station. For example, the substrate 230 may be transferred into the chucking station 190 by the factor interface robot 185 via the opening 206 and placed on the pins 244. Before the substrate 230 is transferred into the chucking station 190, the actuator assembly 240 extends the pins 244 into a loading position, such that the pins 244 are extended beyond the surface 221 of the carrier 220. The pins 244 may pass through cutout regions formed in the carrier 220. The substrate 230 may be positioned by the factor interface robot 185 over the carrier 220 such that the pins 244 are aligned relative to the substrate 230. The actuator assembly 240 lowers the pins 244 towards the surface 241 of the actuator assembly 240, and thus eventually positioning the substrate 230 onto a surface of the carrier 220.

At operation 840, a vacuum is generated between the substrate and chuck 210. For example, the pumping device 262 may remove air from the space (e.g., cavity) formed between the substrate 230 and the chuck 210 via the vacuum ports 314 to generate a vacuum between the substrate 230 and the chuck 210, which cause the external atmospheric pressure to urge the substrate 230 against the carrier 220. Generating the vacuum between the substrate 230 and the chuck 210 holds the substrate 230 to the carrier 220 and mitigates movement of the substrate 230 relative to the carrier 220.

At operation 850, the substrate is electrostatically chucked to the carrier. For example, the power supply 250 may drive chucking voltages onto the electrodes 640, 642 via the electrical pins 612, 614 generating an electrostatic chucking force between the carrier 220 and the substrate 230. Electrostatically chucking the substrate to the carrier may include operation 852, driving a first electrode, e.g., the electrode 642, with a first chucking voltage and biasing a second electrode, e.g., the electrode 640. The first chucking voltage may be a voltage pulse having a voltage magnitude of about 1 KV. Alternatively, the magnitude of the voltage of the first chucking voltage may be more than or less than about 1 KV. Further, the voltage pulse may be a square voltage pulse.

Figure 10:
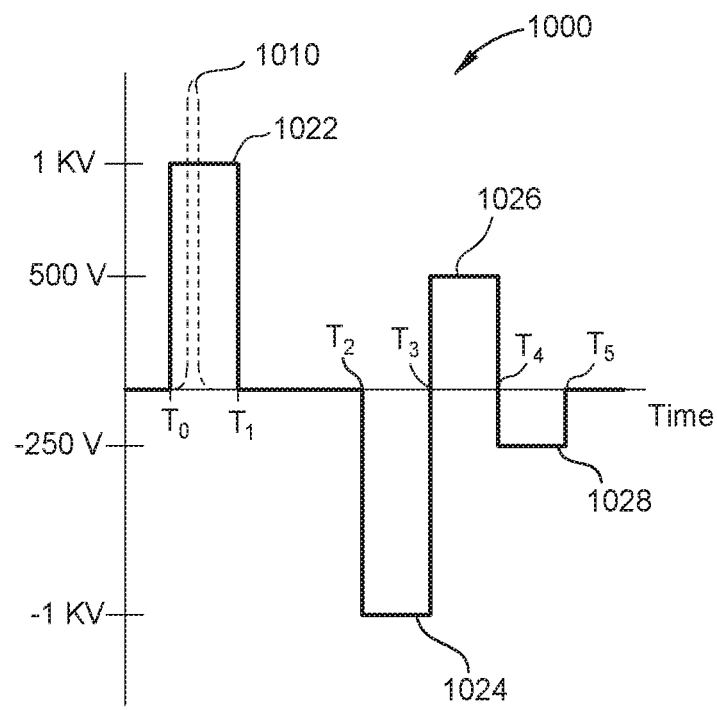
FIG. 10 is a graph of chucking and de-chucking voltages, according to one or more embodiments.

With reference to FIGS. 6 and 10, electrostatically chucking the substrate 230 to the carrier 220 comprises driving the electrode 642 with the chucking voltage 1022 from time $T_0$ to $T_1$. The magnitude of the voltage of the chucking voltage 1022 is about 1 KV; however, voltages having other magnitudes may be utilized. Further, from time $T_0$ to $T_1$, the electrode 640 is negatively biased with respect to the electrode 642 by the power supply 250 via the electrical pin 612. For example, from time $T_0$ to $T_{1\ a}$, a negative voltage pulse having a voltage of about −1 KV (e.g., a magnitude of 1 KV) is driven on the electrode 640 by the power supply 250 via the electrical pin 610. In one example, driving the electrode 642 with a chucking voltage of about 1 KV and biasing the electrode 640 may result in a chucking force of about 3 KgF between the substrate 230 and the carrier 220. Further, as the chucking voltage 1022 is driven, a current spike 1010 is generated. The chucking voltage 1022 is driven using a substantially square-wave pulse (as shown) to promote and enhance the chucking process. Alternatively, the chucking voltage 1022 may be driven with pulses having other shapes.

At operation 860, the vacuum between the carrier and the chuck is released. For example, the pumping device 260 may release the vacuum between the chuck 210 and the carrier 220, such that the carrier 220 may be separated from the chuck 210.

At operation 870, the carrier and wafer are transferred from the chucking station. For example, the actuator assembly 240 may extend the pins 242 away from the surface 241 of the actuator assembly 240 such that the carrier 220 separates from the chuck 210. The factor interface robot 185 may enter the interior region 204 of the chucking station 190, pick-up the carrier 220 and the substrate 230, and transfer the carrier 220 and the substrate 230 from the chucking station 190. The carrier 220 and the substrate 230 may then be transferred to one or more of the processing chambers 112, 114, 116, 118, 132, 136, 138 and 140 for processing. Further, during processing the substrate 230 remains electrostatically chucked to the carrier 220.

Figure 9:
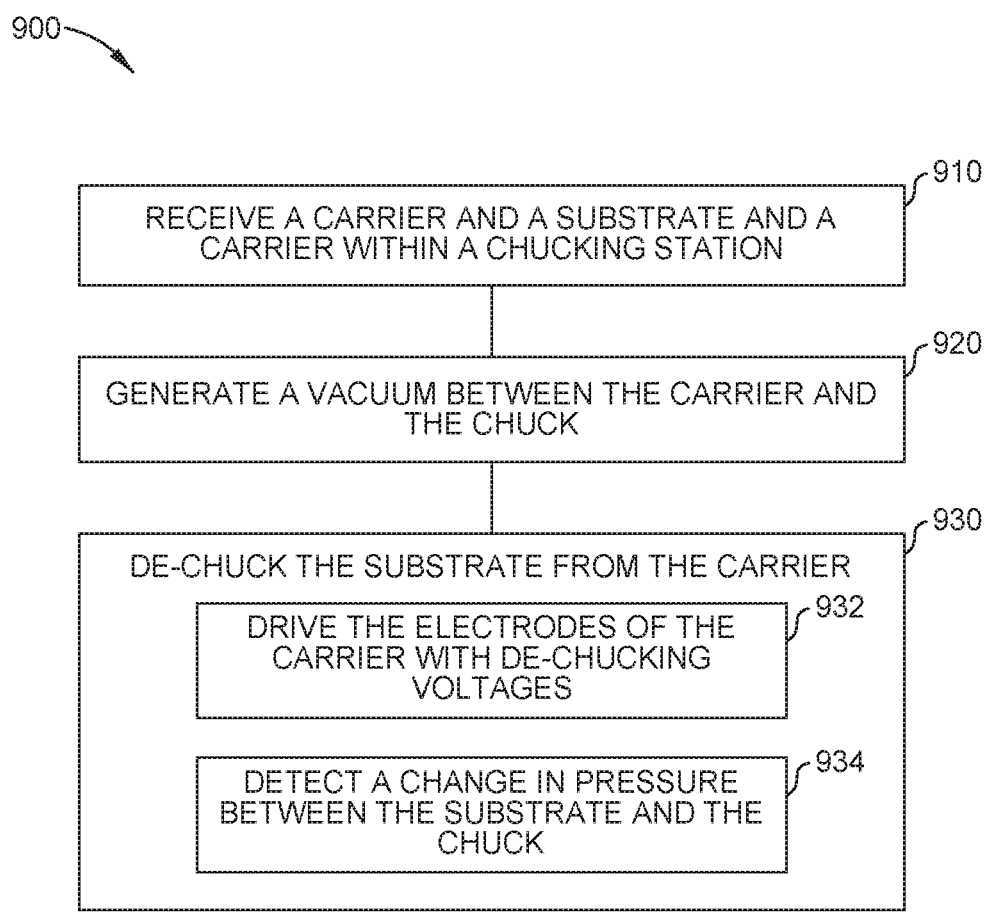
FIG. 9 illustrates a method for de-chucking a substrate from a carrier, according to one or more embodiments.

FIG. 9 is a flow chart of method 900 for removing (electrostatically de-chucking) a substrate from a carrier, according to one or more embodiments. At operation 910, a carrier and substrate is received within a chucking station.

For example, the carrier 220 and the substrate 230 may be transferred into the chucking station 190 by the factor interface robot 185 via the opening 206 and placed on the pins 242. The actuator assembly 240 may extend the pins 242 into a loading position, such that the pins 242 are extended beyond the surface 211 of the chuck 210 and able to receive the carrier 220. The carrier 220 and the substrate 230 may be positioned by the factor interface robot 185 over the chuck 210 such that the pins 242 are aligned with one or more alignment features of the carrier 220. The actuator assembly 240 lowers the pins 242 to retract the carrier 220 toward the surface 241 of the actuator assembly 240, lowering the carrier 220 onto the surface 211 of the chuck 210. The carrier 220 and the substrate 230 may be transferred to the chucking station 190 after the substrate 230 has been processed by one or more of the processing chambers 112, 114, 116, 118, 132, 143, 136, 138 and 140.

At operation 920, a vacuum is generated between the carrier and chuck. For example, the pumping device 260 may remove air from the cavity between the carrier 220 and the chuck 210 via the vacuum ports 316 to generate a vacuum between the carrier 220 and the chuck 210.

At operation 930, the substrate is electrostatically de-chucked (e.g., separated) from the carrier. For example, the electrodes 640, 642 of the carrier 220 may be driven with de-chucking voltages such the substrate 230 may be removed from the carrier 220 (operation 932). The de-chucking voltages driven on the electrodes 640, 642 are opposite in polarity from the voltages driven on the electrodes 640, 642 to electrostatically chuck the substrate 230 to the carrier 220. Electrostatically de-chucking the substrate 230 from the carrier 220 may include driving the electrodes 642 and 640 with alternating positive and negative voltages, and decreasing magnitudes until the substrate 230 is de-chucked from the carrier 220.

For example, with reference to FIGS. 6 and 10, driving the electrodes 640, 642 with de-chucking voltages may include driving the electrode 642 relative to the electrode 640 with a de-chucking voltage 1024 (e.g., driving electrode 640 with a voltage opposite in polarity from the de-chucking voltage 1024) by the power supply 250 as shown from time $T_2$ to $T_3$. The de-chucking voltage 1024 is a negative voltage having a polarity opposite that of the chucking voltage 1022. Further, the de-chucking voltage may have magnitude equal to, greater than, or less than the magnitude of the chucking voltage 1022. Additionally, the de-chucking voltage 1024 may be a negative voltage pulse. Further, the de-chucking voltage may be a square-wave shaped negative voltage pulse, as shown in the graph 1000 of FIG. 10.

Electrostatically de-chucking the substrate 230 from carrier 220 also includes, as indicated by time $T_3$ to $T_4$, driving the electrode 642 relative to electrode 640 with de-chucking voltage 1026 by the power supply 250. The magnitude of de-chucking voltage 1026 is less than that of the chucking voltage 1022. Further, the magnitude of the de-chucking voltage 2016 is less than the magnitude of the de-chucking voltage 1024. Additionally, the magnitude of de-chucking voltage 1026 may be about 500 V. However, other voltages may be utilized. Further, the de-chucking voltage 1026 may be a positive voltage pulse. Additionally, the de-chucking voltage 1026 may be a square-wave positive voltage pulse.

With further reference to FIG. 10, from time $T_4$ to $T_5$, the de-chucking voltage 1028 may be driven on the electrode 642 relative to electrode 640 by the power supply 250. The de-chucking voltage 1028 may have a magnitude less than the magnitude of the de-chucking voltage 1024 and the de-chucking voltage 1026. Further, the second negative voltage may be about −250 V. However, in other embodiments, other voltages may be utilized. Further, the de-chucking voltage 1028 may be a negative voltage pulse. Additionally, the de-chucking voltage 1028 may be a negative voltage square pulse. Further, the electrode 642 is driven relative to electrode 640 with the de-chucking voltages 1024, 1026 and 1028, such that the electrode 640 is driven with a voltage having a similar magnitude and an opposite polarity from that of the de-chucking voltages 1024, 1026 and 1028.

Further, at operation 934, a change in gas pressure between the chuck and the substrate is detected. For example, the chucking station 190 may pump or provide a high pressure gas through the ports 314 to generate a pressure between the chuck 210 and the substrate 230. For example, the pumping device 260 pumps a gas into the cavity between the substrate 230 and the chuck 210. Further, the pumping device 260 or pressure sensor (not shown) in the chuck 210, or in the plumbing line 651, monitors the pressure between the chuck 210 and the substrate 230 and when the pressure drops from an initial pressure level, the pumping device 260 and/or pressure sensor may provide an indication that the substrate 230 has electrostatically de-chucked from the carrier 220. For example, when the substrate 230 has electrostatically de-chucked from the carrier 220, the substrate 230 will be able to move relative to the carrier 220. Accordingly, the gas between the substrate 230 and the chuck 210 may escape, causing the corresponding pressure to drop. An indication provided by the pressure sensor or pumping device 260 that the substrate 230 has been de-chucked from the carrier 220 may be sent to the power supply 250. In response, the power supply 250 stops driving the electrodes 640 and 642 with the de-chucking voltages. Further, the power supply 250 may continue to drive the electrodes 640 and 642 with the de-chucking voltages of alternating polarities and decreasing magnitudes until an indication is provided by the pressure sensor or pumping device 260 that de-chucking has occurred. Additionally, during the de-chucking process, a vacuum may be generated between the carrier 220 and the chuck 210 to hold the carrier 220 place.

Figure 11:
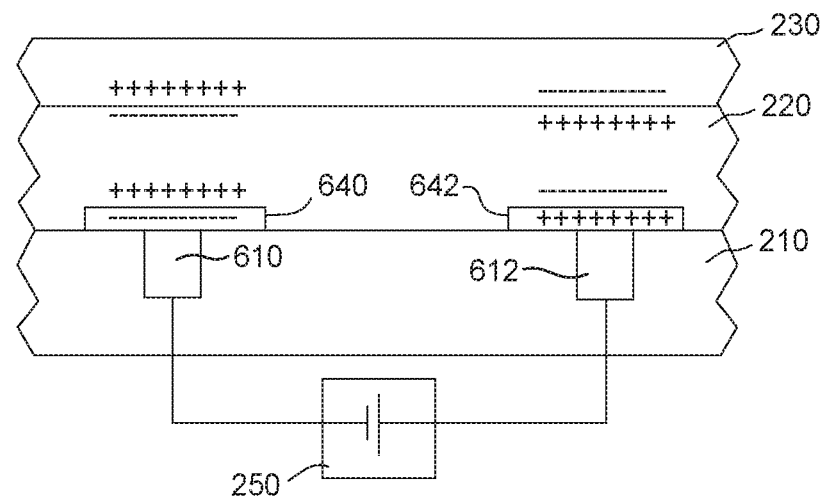
FIG. 11 is a schematic illustration of a carrier electrostatically chucked to a carrier, according to one or more embodiments.

FIG. 11 illustrates an example of the charge buildup between substrate 230 and the carrier 220 in response to driving the electrodes 640 and 642 as describe with regard to FIG. 8. For example, driving electrical pin 612 relative to the electrical pin 610 with the chucking voltage 1022 (e.g., 1 KV or any other positive voltage) generates a positive charge within the electrode 642 and a negative charge within the electrode 640. Accordingly, a region of a negative charge is generated above the electrode 642 and a region of positive charge is generated above the negative charge and proximate the surface of the carrier 220. Accordingly, a region of a negative charge is generated in the substrate 230 due to a buildup of positive charge in an opposing surface of the carrier. Further, a region of a positive charge is generated above the electrode 640 and a region of negative charge is generated above the positive charge and proximate the surface of the carrier 220. Accordingly, a region of a positive charge is generated in the substrate 230. The regions of opposite charge between the substrate 230 and the carrier 220 generate an electrical chucking force (or clamping force) between the substrate 230 and the carrier 220. Thus, the substrate 230 is electrostatically chucked against the carrier 220. After the substrate 230 is electrostatically chucked against the carrier 220, the substrate 230 may be removed from the chucking station 190.

While the foregoing is directed to embodiments of the present disclosure, other and further embodiments of the disclosure may be devised without departing from the basic scope thereof, and the scope thereof is determined by the claims that follow.

What is claimed is:

1. A method for operating a chucking station, the method comprising:
    generating a vacuum between a carrier and a chuck of the chucking station;
    generating a vacuum between a substrate and the chuck, wherein generating the vacuum between the substrate and the chuck causes the substrate to be urged against a surface of the carrier;
    applying a chucking voltage to a first electrode relative to a second electrode of the carrier to electrostatically chuck the substrate to the carrier, wherein the chucking voltage is a positive voltage pulse having a first magnitude;
    applying a first de-chucking voltage to the first electrode relative to the second electrode, wherein the first de-chucking voltage is a negative voltage pulse having a second magnitude; and
    applying a second de-chucking voltage to the first electrode relative to the second electrode, wherein the second de-chucking voltage is a positive voltage pulse having a third magnitude less than the second magnitude.

2. The method of claim 1, further comprising:
    positioning the carrier on the chuck and positioning the substrate on the carrier; and
    removing the carrier and the substrate from the chucking station.

3. The method of claim 1, wherein the first magnitude is equal to the second magnitude.

4. The method of claim 1, further comprising:
    applying a third de-chucking voltage to the first electrode relative to the second electrode, wherein the third de-chucking voltage is a negative voltage pulse having a fourth magnitude less than the third magnitude.

5. The method of claim 4, wherein the chucking voltage, the first de-chucking voltage, the second de-chucking voltage, and the third de-chucking voltage are substantially square wave voltage pulses.

6. The method of claim 1, further comprising:
    delivering a gas into a space between the substrate and the chuck; and
    detecting a change in pressure of the space.

7. The method of claim 6, further comprising:
    removing the substrate from the surface of the carrier.

8. A chucking station comprising:
    a chuck comprising:
        a plurality of first vacuum ports configured to interface with a surface of a substrate when the substrate is positioned over a surface of the chuck;
        a plurality of second vacuum ports configured to interface with a surface of a carrier when the carrier is positioned on the surface of the chuck;
        a first electrical pin configured to be in electrical communication with a first electrode of the carrier when the carrier is positioned on the surface of the chuck; and
        a second electrical pin configured to be in electrical communication with a second electrode of the carrier when the carrier is positioned on the surface of the chuck;
    a power supply configured to apply a chucking voltage and a de-chucking voltage to the first and second electrical pins; and
    one or more pumping elements coupled to the first and second pluralities of vacuum ports and configured to generate a vacuum between the substrate and the chuck and a vacuum between the carrier and the chuck.

9. The chucking station of claim 8, wherein applying the chucking voltage and the de-chucking voltage to the first and second electrical pins comprises:
    applying a first chucking voltage to the first electrode relative to the second electrode via the first and second electrical pins, respectively, wherein the first chucking voltage is a positive voltage pulse having a first magnitude.

10. The chucking station of claim 9, wherein applying the chucking voltage and the de-chucking voltage to the first and second electrical pins further comprises:
    applying a first de-chucking voltage to the first electrode relative to the second electrode via the first and second electrical pins, respectively, wherein the first de-chucking voltage is a negative voltage pulse having a second magnitude.

11. The chucking station of claim 10, wherein the first magnitude is equal to or greater than the second magnitude.

12. The chucking station of claim 10, wherein applying the chucking voltage and the de-chucking voltage to the first and second electrical pins further comprises:
    applying a second de-chucking voltage to the first electrode relative to the second electrode via the first and second electrical pins, respectively, wherein the second de-chucking voltage is a positive voltage pulse having a third magnitude less than the second magnitude; and
    applying a third de-chucking voltage to the first electrode relative to the second electrode via the first and second electrical pins, respectively, wherein the third de-chucking voltage is a negative voltage pulse having a fourth magnitude less than the third magnitude.

13. The chucking station of claim 12, wherein the first chucking voltage, the first de-chucking voltage, the second de-chucking voltage, and the third de-chucking voltage are substantially square wave voltage pulses.

14. A processing system for processing a substrate, the processing system comprising:
    one or more processing chambers;
    a transfer chamber comprising a transfer chamber robot configured to transfer the substrate and a carrier to the one or more processing chambers;
    one or more load lock chambers connected to the transfer chamber;
    a chucking station comprising:
        a chuck comprising:
            a plurality of first vacuum ports configured to interface with a surface of the substrate when the substrate is positioned over a surface of the chuck;
            a plurality of second vacuum ports configured to interface with a surface of the carrier when the carrier is positioned on the surface of the chuck;
            a first electrical pin configured to be in electrical communication with a first electrode of the carrier when the carrier is positioned on the surface of the chuck; and
            a second electrical pin configured to be in electrical communication with a second electrode of the carrier when the carrier is positioned on the surface of the chuck;

a power supply configured to apply a chucking voltage and a de-chucking voltage to the first and second electrical pins; and one or more pumping elements coupled to the first and second pluralities of vacuum ports and configured to generate a vacuum between the substrate and the chuck and a vacuum between the carrier and the chuck; and a transfer robot configured to transfer wafers and carriers between the one or more load lock chambers and the chucking station.

15. The processing system of claim 14, wherein applying the chucking voltage and the de-chucking voltage to the first and second electrical pins comprises:

applying a first chucking voltage to the first electrode relative to the second electrode via the first and second electrical pins, respectively, wherein the first chucking voltage is a positive voltage pulse having a first magnitude.

16. The processing system of claim 15, wherein applying the chucking voltage and the de-chucking voltage to the first and second electrical pins further comprises:

applying a first de-chucking voltage to the first electrode relative to the second electrode via the first and second electrical pins, respectively, wherein the first de-chucking voltage is a negative voltage pulse having a second magnitude.

17. The processing system of claim 16, wherein the first magnitude is equal to or greater than the second magnitude.

18. The processing system of claim 16, wherein applying the chucking voltage and the de-chucking voltage to the first and second electrical pins further comprises:

applying a second de-chucking voltage to the first electrode relative to the second electrode via the first and second electrical pins, respectively, wherein the second de-chucking voltage is a positive voltage pulse having a third magnitude less than the second magnitude; and applying a third de-chucking voltage to the first electrode relative to the second electrode via the first and second electrical pins, respectively, wherein the third de-chucking voltage is a negative voltage pulse having a fourth magnitude less than the third magnitude.

19. The processing system of claim 14, wherein the transfer robot transfers the substrate electrostatically chucked to the carrier from the chucking station to the one or more load lock chambers.

* * * * *